United States Patent
Khemani (10) Patent No.: US 9,413,388 B1
(45) Date of Patent: Aug. 9, 2016

(54) MODIFIED HUFFMAN DECODING

(71) Applicant: Dell Products L.P., Round Rock, TX (US)

(72) Inventor: Lucky Pratap Khemani, Bangalore (IN)

(73) Assignee: Dell Products L.P., Round Rock, TX (US)

( * ) Notice: Subject to any disclaimer, the term of this patent is extended or adjusted under 35 U.S.C. 154(b) by 6 days.

(21) Appl. No.: 14/609,706

(22) Filed: Jan. 30, 2015

(51) Int. Cl.
*G10L 21/00* (2013.01)
*H03M 7/42* (2006.01)
*G10L 19/008* (2013.01)

(52) U.S. Cl.
CPC ............ *H03M 7/425* (2013.01); *G10L 19/008* (2013.01)

(58) Field of Classification Search
USPC .................................. 704/200–232, 500–504
See application file for complete search history.

(56) References Cited

U.S. PATENT DOCUMENTS

| | | | |
|---|---|---|---|
| 2006/0290537 A1* | 12/2006 | Bay .................. | H03M 7/42 341/50 |
| 2007/0024472 A1* | 2/2007 | Oh ................... | H03M 7/40 341/50 |
| 2010/0235171 A1* | 9/2010 | Takagi .............. | G10L 19/008 704/500 |

OTHER PUBLICATIONS

Hashemian, Reza. "Memory Efficient and High-Speed Search Huffman Coding". IEEE Transactions on Communications, vol. 43, No. 10, Oct. 1995, pp. 2576-2581.*

* cited by examiner

*Primary Examiner* — Jesse Pullias
(74) *Attorney, Agent, or Firm* — Lee & Hayes, PLLC (57) ABSTRACT

A plurality of bits is retrieved from a bitstream that comprises encoded media content. The plurality of bits may include at least a portion of a codeword. An integer value of the plurality of bits is used to determine an index into a first table. Based on the index, an extra bits field is retrieved from the first table. If the extra bits field includes a predetermined value, then a first plurality of values is retrieved from the first table. If the extra bits field does not include the predetermined value, then a second plurality of values is retrieved from a second table.

20 Claims, 9 Drawing Sheets

300

MODIFIED HUFFMAN CODEBOOK (WITH NEW COLUMNS)

| X-VALUE 202 | Y-VALUE 204 | HLEN 206 | NEW BINARY CODEWORD 302 | NEW INTEGER CODEWORD 304 |
|---|---|---|---|---|
| 0 | 0 | 3 | 1110000 | 112 |
| 0 | 1 | 3 | 0110000 | 48 |
| 0 | 2 | 5 | 0010100 | 20 |
| 0 | 3 | 7 | 0000001 | 1 |
| 1 | 0 | 3 | 1100000 | 96 |
| 1 | 1 | 2 | 1000000 | 64 |
| 1 | 2 | 4 | 0011000 | 24 |
| 1 | 3 | 5 | 0001000 | 8 |
| 2 | 0 | 4 | 0101000 | 40 |
| 2 | 1 | 4 | 0100000 | 32 |
| 2 | 2 | 5 | 0010000 | 16 |
| 2 | 3 | 6 | 0000010 | 2 |
| 3 | 0 | 6 | 0000110 | 6 |
| 3 | 1 | 5 | 0001100 | 12 |
| 3 | 2 | 6 | 0000100 | 4 |
| 3 | 3 | 7 | 0000000 | 0 |

FIG. 1

ORIGINAL HUFFMAN CODEBOOK

| X-VALUE 202 | Y-VALUE 204 | HLEN 206 | BINARY CODEWORD 208 |
|---|---|---|---|
| 0 | 0 | 3 | 111 |
| 0 | 1 | 3 | 011 |
| 0 | 2 | 5 | 10100 |
| 0 | 3 | 7 | 1000000 |
| 1 | 0 | 3 | 110 |
| 1 | 1 | 2 | 10 |
| 1 | 2 | 4 | 1100 |
| 1 | 3 | 5 | 10000 |
| 2 | 0 | 4 | 1010 |
| 2 | 1 | 4 | 1000 |
| 2 | 2 | 5 | 10000 |
| 2 | 3 | 6 | 100000 |
| 3 | 0 | 6 | 110000 |
| 3 | 1 | 5 | 11000 |
| 3 | 2 | 6 | 100000 |
| 3 | 3 | 7 | 0000000 |

MODIFIED HUFFMAN CODEBOOK (WITH NEW COLUMNS)

| X-VALUE 202 | Y-VALUE 204 | HLEN 206 | NEW BINARY CODEWORD 302 | NEW INTEGER CODEWORD 304 |
|---|---|---|---|---|
| 0 | 0 | 3 | 1110000 | 112 |
| 0 | 1 | 3 | 0110000 | 48 |
| 0 | 2 | 5 | 0010100 | 20 |
| 0 | 3 | 7 | 0000001 | 1 |
| 1 | 0 | 3 | 1100000 | 96 |
| 1 | 1 | 2 | 1000000 | 64 |
| 1 | 2 | 4 | 0011000 | 24 |
| 1 | 3 | 5 | 0001000 | 8 |
| 2 | 0 | 4 | 0101000 | 40 |
| 2 | 1 | 4 | 0100000 | 32 |
| 2 | 2 | 5 | 0010000 | 16 |
| 2 | 3 | 6 | 0000010 | 2 |
| 3 | 0 | 6 | 0000110 | 6 |
| 3 | 1 | 5 | 0001100 | 12 |
| 3 | 2 | 6 | 0000100 | 4 |
| 3 | 3 | 7 | 0000000 | 0 |

NEW HUFFMAN CODEBOOK
(SORTED BY ASCENDING ORDER OF CODEWORD)

| X-VALUE 202 | Y-VALUE 204 | HLEN 206 | NEW BINARY CODEWORD 302 | NEW INTEGER CODEWORD 304 |
|---|---|---|---|---|
| 3 | 3 | 7 | 0000000 | 0 |
| 0 | 3 | 7 | 0000001 | 1 |
| 2 | 3 | 6 | 0000010 | 2 |
| 3 | 2 | 6 | 0000100 | 4 |
| 3 | 0 | 6 | 0000110 | 6 |
| 1 | 3 | 5 | 0001000 | 8 |
| 3 | 1 | 5 | 0001100 | 12 |
| 2 | 2 | 5 | 0010000 | 16 |
| 0 | 2 | 5 | 0010100 | 20 |
| 1 | 2 | 4 | 0011000 | 24 |
| 2 | 1 | 4 | 0100000 | 32 |
| 2 | 0 | 4 | 0101000 | 40 |
| 0 | 1 | 3 | 0110000 | 48 |
| 1 | 1 | 2 | 1000000 | 64 |
| 1 | 0 | 3 | 1100000 | 96 |
| 0 | 0 | 3 | 1110000 | 112 |

FIG. 4

MODIFIED OFFSET 508   1ST NEW TABLE 116

| BINARY CODEWORD 502 | OFFSET 504 | EXTRA BITS FIELD 506 | X-VALUE 202 | Y-VALUE 204 | HLEN 206 |
|---|---|---|---|---|---|
| 00000 | 0 | 2 | - | - | - |
| 00001 | 3 | 1 | - | - | - |
| 00010 | - | 0 | 1 | 3 | 5 |
| 00011 | - | 0 | 3 | 1 | 5 |
| 00010 | - | 0 | 2 | 2 | 5 |
| 00101 | - | 0 | 0 | 2 | 5 |
| 00110 | - | 0 | 1 | 2 | 4 |
| 00111 | - | 0 | 1 | 2 | 4 |
| 01000 | - | 0 | 2 | 1 | 4 |
| 01001 | - | 0 | 2 | 1 | 4 |
| 01010 | - | 0 | 2 | 0 | 4 |
| 01011 | - | 0 | 2 | 0 | 4 |
| 01100 | - | 0 | 0 | 1 | 3 |
| 01101 | - | 0 | 0 | 1 | 3 |
| 01110 | - | 0 | 0 | 1 | 3 |
| 01111 | - | 0 | 0 | 1 | 3 |
| 10000 | - | 0 | 1 | 1 | 2 |
| 10001 | - | 0 | 1 | 1 | 2 |
| 10010 | - | 0 | 1 | 1 | 2 |
| 10011 | - | 0 | 1 | 1 | 2 |
| 10100 | - | 0 | 1 | 1 | 2 |
| 10101 | - | 0 | 1 | 1 | 2 |
| 10110 | - | 0 | 1 | 1 | 2 |
| 10111 | - | 0 | 1 | 1 | 2 |
| 11000 | - | 0 | 1 | 0 | 3 |
| 11001 | - | 0 | 1 | 0 | 3 |
| 11010 | - | 0 | 1 | 0 | 3 |
| 11011 | - | 0 | 1 | 0 | 3 |
| 11100 | - | 0 | 0 | 0 | 3 |
| 11101 | - | 0 | 0 | 0 | 3 |
| 11110 | - | 0 | 0 | 0 | 3 |
| 11111 | - | 0 | 0 | 0 | 3 |

MODIFIED HUFFMAN DECODING

BACKGROUND

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Many techniques for decoding a bitstream, such as an encoded audio bitstream, use a Huffman decoding table. For example, Motion Picture Experts Group (MPEG) 2 layer 3 audio encoding, often referred to as MP3 encoding, uses a Huffman table to decode the bitstream to playback the encoded audio. However, decoding an encoded audio bitstream, such as MP3, using a Huffman table is very inefficient and expensive in terms of resource (e.g., processor) utilization. Typically, the Huffman decoding for an MP3 bitstream consumes between 30% to 50% of the processing resources used during the decoding process. One of the reasons is the Huffman decoding consumes so many computing resources is due to the large number of table searches that are performed during decoding. Existing Huffman coding tables do not enable fast (e.g., direct access) to entries.

SUMMARY

This Summary provides a simplified form of concepts that are further described below in the Detailed Description. This Summary is not intended to identify key or essential features and should therefore not be used for determining or limiting the scope of the claimed subject matter.

A plurality of bits are retrieved from a bitstream that comprises encoded media content. The plurality of bits may include at least a portion of a codeword. An integer value of the plurality of bits is used to determine an index into a first table. Based on the index, an extra bits field is retrieved from the first table. If the extra bits field includes a predetermined value, then a first plurality of values is retrieved from the first table. If the extra bits field does not include the predetermined value, then a second plurality of values is retrieved from a second table.

BRIEF DESCRIPTION OF THE DRAWINGS

A more complete understanding of the present disclosure may be obtained by reference to the following Detailed Description when taken in conjunction with the accompanying Drawings. In the figures, the left-most digit(s) of a reference number identifies the figure in which the reference number first appears. The same reference numbers in different figures indicate similar or identical items.

DETAILED DESCRIPTION

For purposes of this disclosure, an information handling system may include any instrumentality or aggregate of instrumentalities operable to compute, calculate, determine, classify, process, transmit, receive, retrieve, originate, switch, store, display, communicate, manifest, detect, record, reproduce, handle, or utilize any form of information, intelligence, or data for business, scientific, control, or other purposes. For example, an information handling system may be a personal computer (e.g., desktop or laptop), tablet computer, mobile device (e.g., personal digital assistant (PDA) or smart phone), server (e.g., blade server or rack server), a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, touchscreen and/or video display. The information handling system may also include one or more buses operable to transmit communications between the various hardware components.

Systems and techniques are described herein for creating Huffman codebooks to significantly improve the resource usage (e.g., processor utilization) of Huffman decoding. For example, Huffman decoding of an MP3 bitstream, using the systems and techniques described herein, may be approximately five times faster as compared to using conventional Huffman decoding. Purely for illustration purposes, the systems and techniques are described using decoding an MP3 bitstream as an example. However, the systems and techniques described herein may be applied to improving the performance of any bitstream decoder that uses Huffman encoding, including multichannel audio bitstreams, other types of encoded audio bitstreams, or any combination thereof.

The techniques include creating two new tables from one or more existing Huffman codebooks (e.g., table). For example, in MP3 decoding, thirty-four Huffman codebooks are used. In some embodiments, e.g., where fast MP3 decoding is desired and there are no memory constraints, two new tables may be created from each of the thirty-four Huffman codebooks. In other embodiments, e.g., where memory is constrained, two new tables may be created from at least one of the thirty-four Huffman codebooks. For example, larger tables (e.g., tables having greater than a predetermined threshold number of rows) of the thirty-four Huffman codebooks may each be split into two new tables to provide faster lookup while smaller tables may not be split into two tables. Instead, the smaller tables may be used in a conventional manner, without modification.

The two new tables may then be used to decode an audio bitstream, such as an MP3 audio bitstream. For example, for each entry in an existing (e.g., conventional or old) Huffman codebook, two new codewords are created and added to create a new Huffman codebook. The two new codewords include a new binary codeword that is derived from an existing (e.g., conventional) codeword and a new integer codeword corresponding to the binary codeword. The new binary codeword may be derived by determining a length of the longest codeword in the Huffman codebook and then appending (e.g., padding) each binary codeword in the Huffman codebook with sufficient zeros such that the length of each padded binary codeword is equal to the length of the longest codeword. The new Huffman codebook is sorted in ascending order according the value of the new codewords. After being sorted, the new Huffman codebook is split into two tables, e.g., a first new table and a second new table. The two tables are then used to decode a bitstream, such as an MP3 bitstream. If M is the number of bits in the largest codeword in the Huffman codebook, the two tables may be created based on N number of bits, where N is less than M. For example, in a Huffman codebook where the largest codeword is M=7 bits in length, the first new table may be used for codewords that are N=5 bits or less in length while the second table may be used for codewords having a length greater than 5 bits, e.g., a length of 6 bits or 7 bits. As another example, in a Huffman codebook where the largest codeword is M=10 bits in length, the first new table may be used for codewords that are N=7 bits or less in length while the second table may be used for codewords having a length greater than 7 bits, e.g., a length of 8, 9, or 10 bits. Because the first new table is derived from a new Huffman codebook that is sorted in ascending order of an integer value of each codeword, N-bits can be retrieved from the bitstream and the integer value of the N-bits used to directly access a particular row of the first new table. If a flag indicates that the N-bits have a corresponding entry in the first new table, then the spectral values are directly read from the first new table. If the flag indicates that the N-bits have a corresponding entry in the second new table, then one or more extra bits are retrieved from the bitstream, an offset is read from the first new table, and the offset used to access an entry in the second new table. In contrast, when using a conventional Huffman codebook, one bit at a time is retrieved from the bitstream and each time a search of the Huffman codebook is performed to determine if the retrieved bits match one of the entries of the Huffman codebook. Thus, using the two new tables enables spectral values to be retrieved using one, or at most two, table lookups rather than using multiple table searches, enabling much faster Huffman decoding.

The two new tables may be created from each of one or more existing Huffman codebooks. For example, the new tables may be created at a particular time, such as offline, during bootup, or the like. After the new tables have been created, they may be stored and used whenever an MP3 bitstream is to be decoded. For example, the new tables may be created and included in a media decoder that is embedded in (a) a logic of an integrated circuit, (b) a firmware of a device (e.g., a computing device, a camera, a phone, a media playback device, or the like), (c) an operating system, (d) a device driver, (e) a software application, etc. As another example, the new tables may be included in a media decoder that is embedded into a multimedia file. When the audio file is selected for playback, the media decoder may use the new tables to decode the audio of the multimedia file. Of course, the new tables for Huffman decoding may be distributed and used in any number of other ways.

Figure 1:
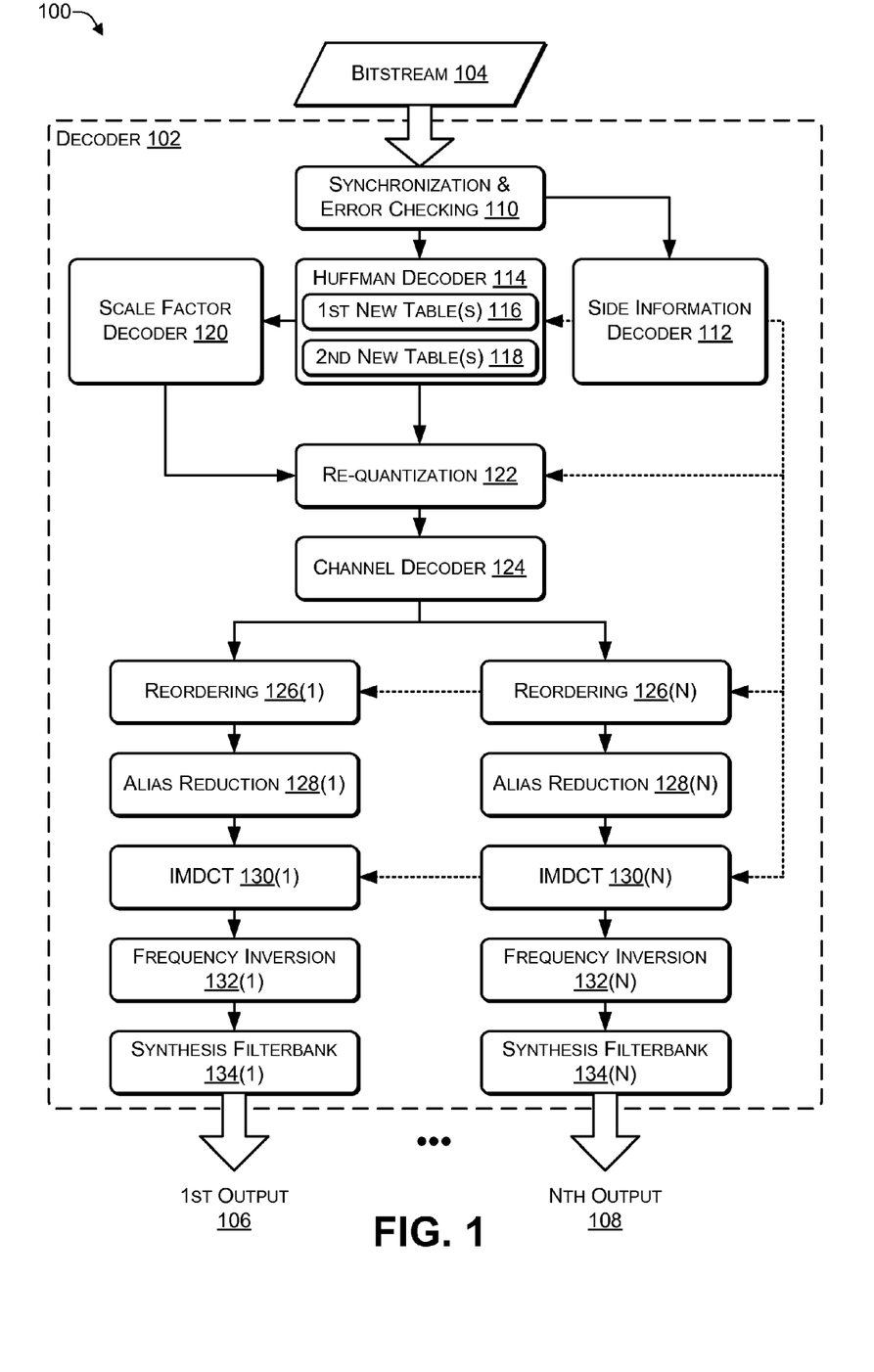
FIG. 1 is a block diagram illustrating a system to decode a bitstream according to some embodiments.

FIG. 1 is a block diagram illustrating a system 100 to decode a bitstream. The system 100 includes a decoder 102 to receive a bitstream 104 and decode the bitstream 104 to one or more outputs, such as, a first output 106 and an Nth output 108 (where N>1). While the decoder 102 is illustrated as decoding the bitstream 104, the bitstream 104 may be generated from a local file, or from a file that is located remotely and streamed across a network to the decoder 102. When the bitstream 104 includes an audio bitstream, the decoder 102 may decode the bitstream 104 to provide a stereo output (e.g., N=2), a surround output (e.g., N=5, 7, or the like), or other multi-channel output.

As illustrated in FIG. 1, the decoder 102 may be capable of decoding MPEG encoded bitstreams (or files), such as MP3 bitstreams (or files). The decoder 102 may include various software modules for decoding the bitstream 104. The decoder 102 may include a synchronization and error checking module 110, a side information decoder 112, a Huffman decoder 114 using a first set of new table(s) 116 and a second set of new table(s) 118, a scale factor decoder 120, a re-quantization module 122, and a channel decoder 124. The channel decoder 124 may decode the bitstream 104 into multiple channels, by performing, for each channel, reordering 126, alias reduction 128, inverse modified discrete cosine transform (IMDCT) 130, frequency inversion 132, and synthesis filterbank 134. The first set of new table(s) 116 and the second set of new table(s) 118 may be derived from one or more of the 34 Huffman codebooks.

The synchronization and error checking module 110 receives the incoming bitstream 104 and identifies each frame within the bitstream 104 by searching for a synchronization word. This enables each frame of the bitstream 104 to be identified and processed. Each frame includes (i) a header, (ii) a cyclic redundancy check (CRC), (iii) side information, (iv) main data, and (v) ancillary data.

The side information decoder 112 decodes the side information of each frame of the bitstream 104. The side information includes information used to decode the main data of the frame.

Huffman coding is a variable length coding method. The Huffman decoder 114 uses the new tables 116, 118 (that may be derived from a conventional Huffman codebook) to decode the bitstream 104. The new tables 116, 118 may enable fast lookup compared to a conventional Huffman codebook. In Huffman coding, codewords are assigned to spectral values based on how often the spectral values occur, with short codewords being assigned to the most probable values. Each codeword is an n-bit integer. For example, for MP3, the compressed data in the bitstream 104 may include frequency domain samples. Each logical frame has up to four chunks with each chunk including up to 576 frequency samples. For a 44100 Hertz (Hz) audio signal, the first frequency sample (index 0) represents a frequency at approximately 0 Hz, while the last sample (index 575) represents a frequency at approximately 22050 Hz. In MP3, the samples are divided into five different regions of variable length. The first three regions are referred to as the big value regions, the fourth region is referred to as the quad region, and the fifth region is referred to as the zero region. The samples in the zero region are all zero, and are therefore not Huffman coded. If the big value regions and the quad region decode to 400 samples, then the remaining 176 are padded with 0. The three big values regions represent the important lower frequencies in audio, and when decoded may include integers in the range −8206 to 8206. The three big values regions are coded with three different Huffman tables that are defined in the MP3 standard. The MP3 standard defines 15 large tables for the three big regions, where each table outputs two frequency samples for a given codeword. The Huffman codebook tables are designed to compress the most common content of the frequency regions as much as possible. To increase compression, the 15 tables are paired with an additional parameter for a total of 29 different ways in which each of the three regions can be compressed. The side information include information at to which of the 29 is being used for compression.

The scale factor decoder 120 decodes scale factors used to scale the de-quantization. For example, for MP3 decoding, each frequency band may have a corresponding scale factor.

Quantization involves converting a real number into an integer using an encoding process. In the decoding process, the quantization process is reversed to obtain frequency lines. The decoded, scaled, and quantized frequency lines output from the Huffman decoder 114 are re-quantized by the re-quantization module 122 using the scale factors to restore the frequency lines. For example, raw integer sample values for 576 frequency lines that are obtained after Huffman decoding may be re-quantized and scaled. The re-quantization module 122 may re-quantize and then perform scaling by multiplying the re-quantized values with the corresponding scale factors. The scaled frequencies may be stored for the channel decoder 124 to process.

The channel decoder 124 may decode each of the N channels using the scaled frequencies provided by the re-quantization module 122. The frequency lines generated by the re-quantization module 122 may not be correctly ordered. For example, to increase the efficiency of the Huffman coding, the frequency lines in the bitstream 104 may have been reordered and may not be in the correct order for outputting. For each of N outputs 106, 108, the reordering module 126(1) to (N) may re-order at least a portion of the frequency lines.

Aliasing refers to a distortion (e.g., artifact) that may result when a signal is reconstructed from samples. The aliasing may include temporal aliasing for an audio signal. The alias reduction module 128 may use various techniques to reduce the aliasing resulting from reconstructing the analog outputs 106, 108 from the digital bitstream 104.

The inverse modified discrete cosine transform (IMDCT) is a lapped transform that is performed on consecutive blocks of a larger dataset, where subsequent blocks are overlapped so that the last half of one block coincides with the first half of the next block. This overlapping helps to avoid artifacts stemming from the block boundaries. The frequency lines from the alias reduction modules 128(1) to (N) may be mapped to 32 polyphase filter sub-bands. The IMDC modules 130(1) to 130(N) may output 18 time domain samples for each of the 32 sub-bands.

The frequency inversion modules 132(1) to 132(N) may compensate for frequency inversions in the synthesis (polyphase) filterbank 134 (1) to 134(N) by, for example, multiplying every odd time sample of every odd sub-band by −1.

The synthesis filterbanks 134(1) to 134(N) may transform the 32 sub-bands of 18 time domain samples in each granule of the bitstream 104 into 18 blocks of 32 PCM samples, which are provided as the decoding result via the N outputs 106 to 108.

Thus, the decoder 102 may decode the digital bitstream 104 to create the analog N outputs 106 to 108. The digital bitstream 104 may include encoded content, such as audio content, including MPEG compliant content. For example, the decoder 102 may decode an MP3 bitstream to create two or more analog outputs 106 to 108. The Huffman decoder 114 may use the new tables 116, 118 to decode the bitstream 104 significantly faster (e.g., up to five times faster) than a decoder that uses a Huffman decoder with a conventional Huffman codebook.

A decoder using a conventional Huffman codebook may retrieve multiple bits, one bit at a time from the bitstream 104, and perform multiple searches of the conventional Huffman codebook to determine whether the retrieved bit sequence matches a codeword in the conventional Huffman codebook. In contrast, the decoder 102 may perform a lookup in the first new table 116, and if the bit sequence matches a codeword in the first new table 116, the appropriate values are retrieved from the first new table 116. If the bit sequence does not match a codeword in the first new table 116, data for retrieving the codeword from the second table 118 are retrieved from the first new table 116, and the appropriate values are retrieved from the second new table 118. Thus, the Huffman decoder 114 may use one or at most two table lookups as compared to a conventional Huffman decoder in which three, four, or more table lookups (e.g., table searches) may be performed for each bit sequence. In this way, the decoder 102 using the new tables 116, 118 may be up to five times faster as compared to a conventional decoder that uses a conventional Huffman decoder with a conventional Huffman codebook.

Figure 2:
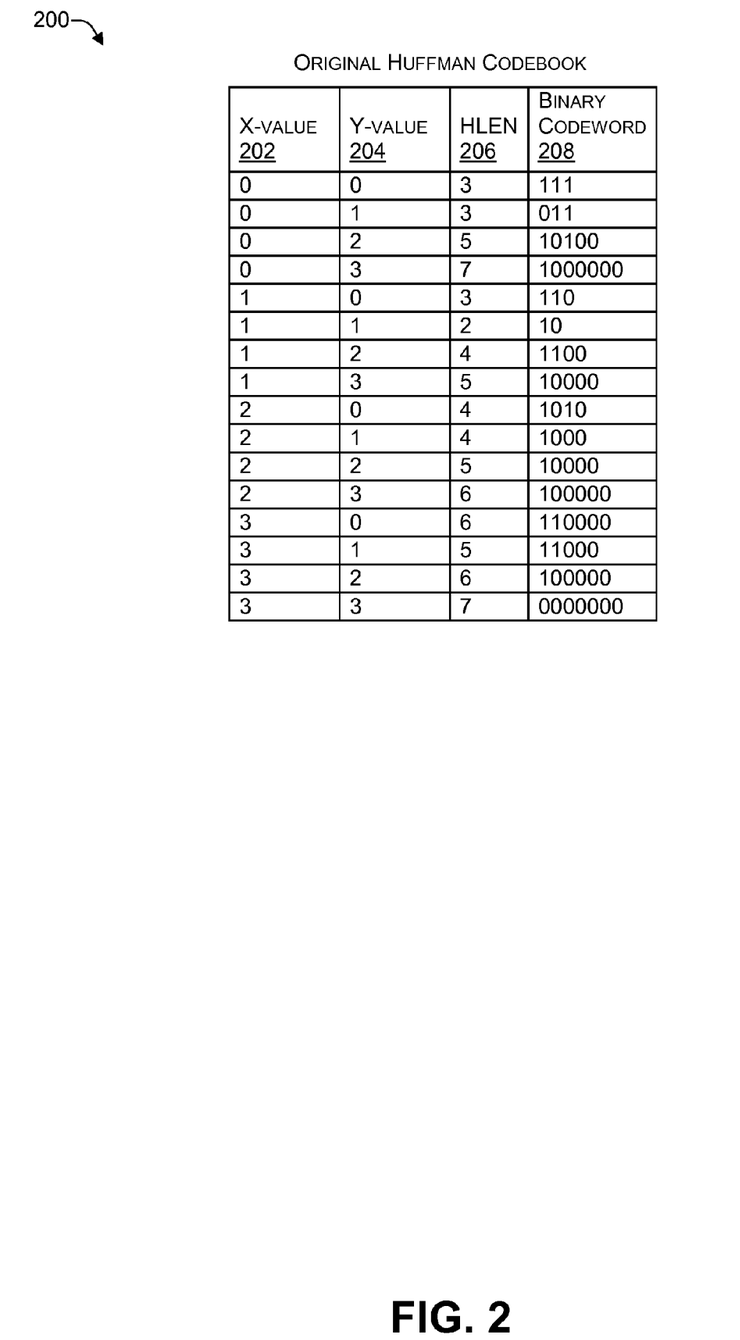
FIG. 2 illustrates an example of an original Huffman codebook according to some embodiments.

FIG. 2 illustrates an example of an original Huffman codebook 200 (e.g., Huffman codebook 6) according to some embodiments. The original Huffman codebook 200 may include multiple entries, with each entry including an index 202, an X-value 204, a Y-value 206, a Huffman codeword length (abbreviated "hlen") 208, and a binary codeword 210. The hlen 208 identifies the length in bits of each corresponding codeword.

In a conventional Huffman decoder, a first bit is retrieved from a bitstream, and a search is done to determine if the first bit matches the binary codeword 210 (with an hlen 206 of one) in one of the rows of the original Huffman codebook 200. If the first bit matches the binary codeword 210 of one of the entries, then the X-value 204 and the Y-value 206 (spectral values) are read from the original Huffman codebook 200. If the first bit does not match any of the binary codewords 210, a second bit is retrieved and a search is done to determine if the first bit and the second bit matches the binary codeword 210 (e.g., hlen=2) of one of the entries in the original Huffman codebook 200. In this manner, bits are repeatedly retrieved from the bitstream, concatenated to the previously retrieved bit(s), and a search of the table done until the concatenated bits match one of the binary codewords 210 in the original Huffman codebook 200.

For example, if "0" is the first bit retrieved, then "0" does not match any of the binary codewords 210 (with hlen=1) and so a second bit is retrieved from the bitstream. If the second bit is "1," then a search of the original Huffman codebook 200 is done to determine if "01" (with hlen=2) matches one of the binary codewords 210. Because "01" (with hlen=2) does not match any of the binary codewords 210, a third bit is retrieved from the bitstream. If the third bit is "1," then a search of the original Huffman codebook 200 is performed to determine if "011" (with hlen=3) matches any of the codewords 210. In this example, "011" matches the binary codeword 210 of the second row in the original Huffman codebook 200 and the spectral values "0" (corresponding to X-value 204) and "1" (corresponding to Y-value 206) are retrieved from the original Huffman codebook 200. This process of retrieving bits and searching the original Huffman codebook 200 until a match is found is repeated to extract all the codewords and decode the codewords to their corresponding X-values 204 and Y-values 206.

Figure 3:
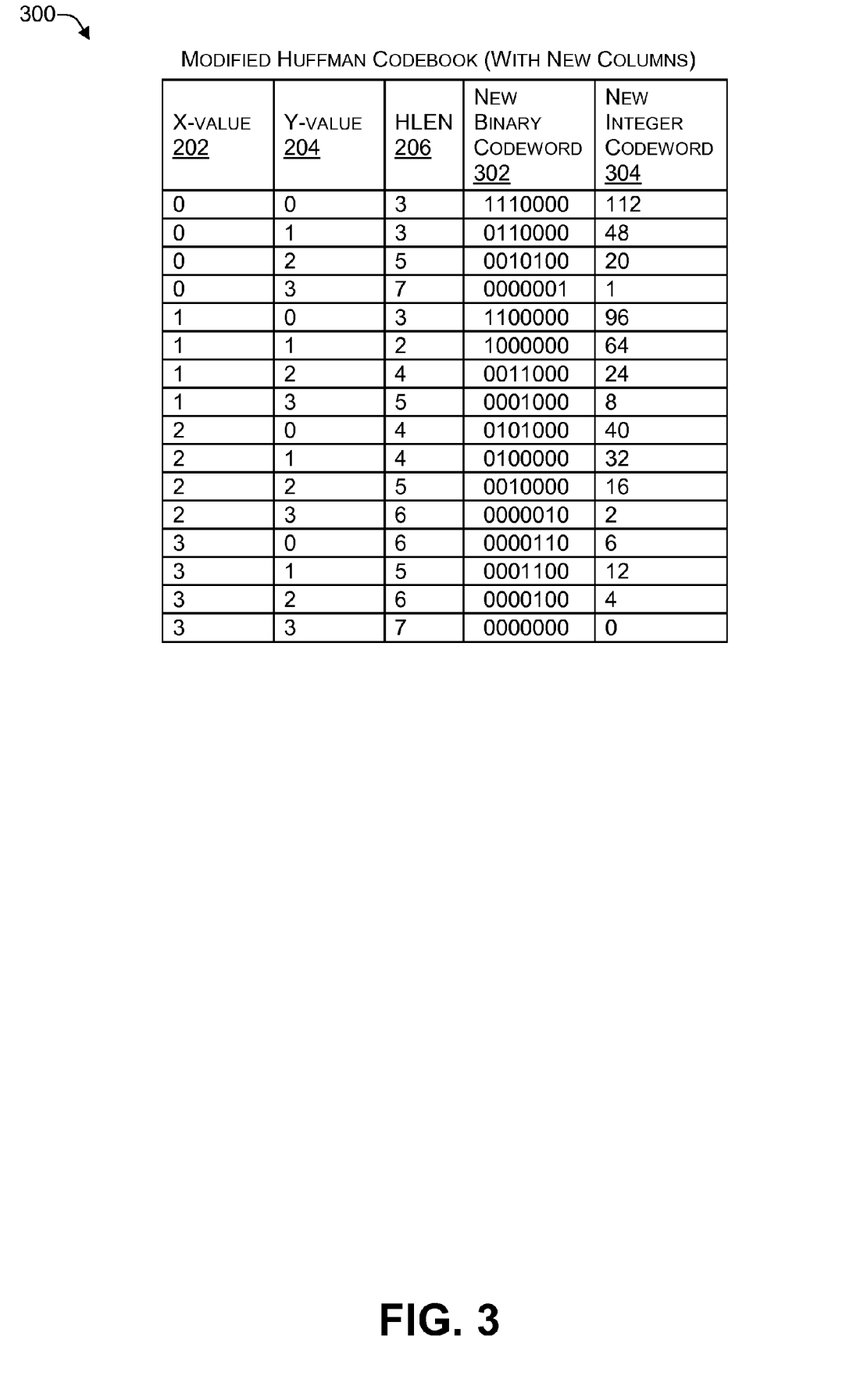
FIG. 3 illustrates an example of a modified Huffman codebook with a new codeword column according to some embodiments.

FIG. 3 illustrates an example of a modified Huffman codebook 300 with a new column according to some embodiments. For example, a new codeword columns may be created by determining a new binary codeword 402 for one or more rows of the sorted Huffman codebook 300 of FIG. 3. For ease of understanding, a new integer codeword 404 that represents an integer value of the corresponding new binary codeword 402 is illustrated in FIG. 3. However, in some implementations, the new integer codeword 404 may not be present in the modified Huffman codebook 300. The new binary codeword 402 may replace the binary codeword 210 and may be created by appending zeros to the binary codeword 210 from the original Huffman codebook 200 of FIG. 2.

The new binary codeword 302 is created by first determining a longest codeword, e.g., a largest hlen 208, in the original Huffman codebook 200. The largest hlen 208 in the original Huffman codebook 200 is referred to herein as maxhlen. Next, each binary codeword 210 may be padded (e.g., appended) with a sufficient number of trailing zeros such that each new binary codeword 302 has a total length (in bits) of maxhlen. In the original Huffman codebook 200, the largest hlen 208 is seven and thus maxhlen is seven. Therefore, each new binary codeword 302 in the Huffman codebook 300 is padded to have a length in bits of seven (e.g., maxhlen). For example, each new binary codeword 302 in the Huffman codebook 300 is padded using (maxhlen−hlen) trailing zeros. The new integer codeword 304 is the integer value of the corresponding new binary codeword 302. Note that if hlen=maxhlen, then no zeros are added. For example, when maxhlen=7, codewords with an hlen=7 are not padded.

To illustrate, the binary codeword 210 of "111" is padded with maxhlen−hlen (7−3=4) zeros to create the new binary codeword 302 "1110000" and the corresponding new integer codeword 304 "112." The binary codeword 210 of "011" is padded with maxhlen−hlen (7−3=4) zeros to create the new binary codeword 302 "0110000" and the corresponding new integer codeword 304 "48." The binary codeword 210 of "00101" is padded with maxhlen−hlen (7−5=2) zeros to create the new binary codeword 302 "0010100" and the corresponding new integer codeword 304 "20." Similarly, each entry where hlen<maxhlen is padded with trailing zeros to create the new binary codeword 302 having the corresponding integer value of new integer codeword 304. The binary codeword 210 of "0000001" and "0000000" are not padded because maxhlen−hlen (7−7) is zero. Thus, binary codewords having an hlen=maxhlen are not padded. Though the length of each new binary codeword 302 in the Huffman codebook 300 is maxhlen, the hlen 208 field is not changed as the hlen 208 field may be used later to extract the binary codeword 210 from the new binary codeword 302.

Figure 4:
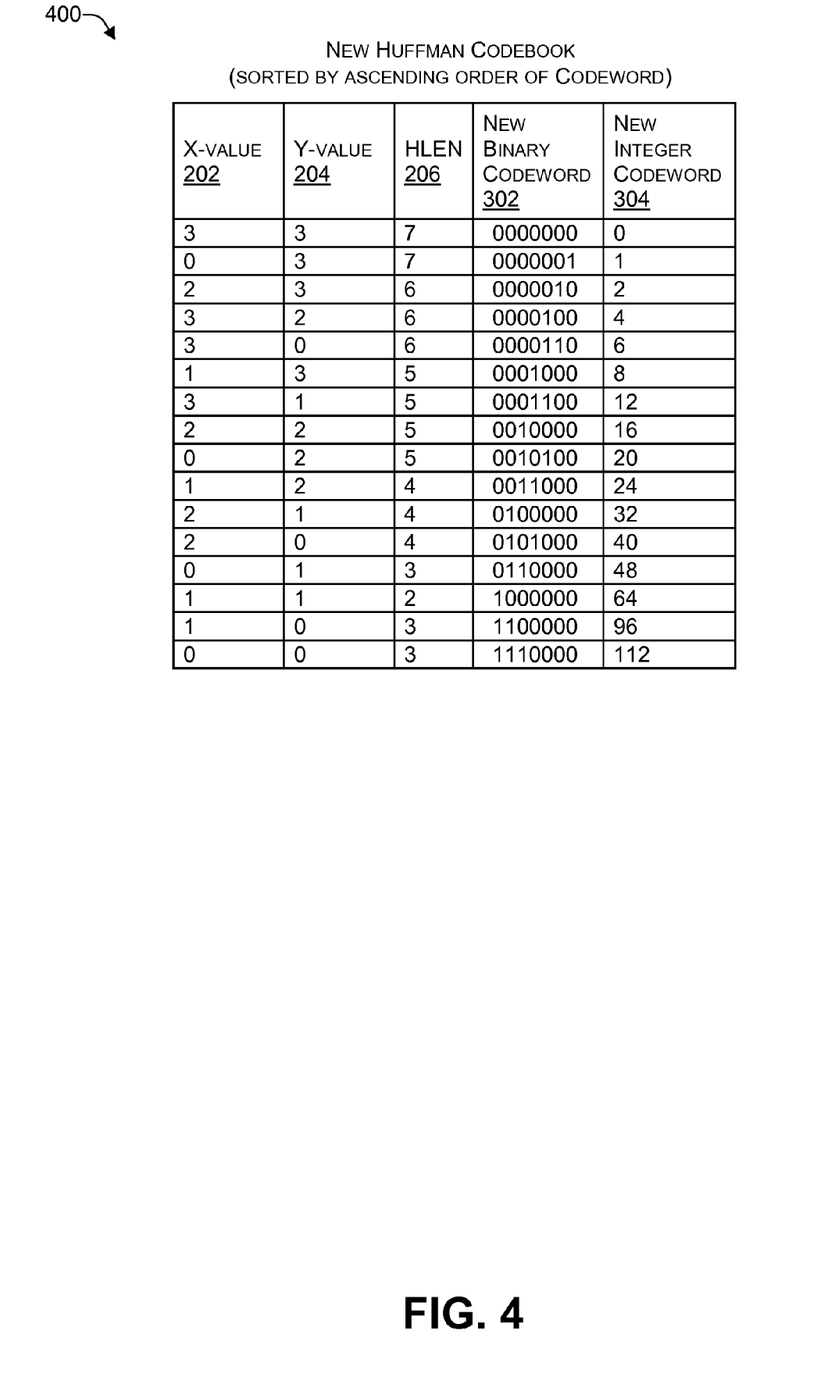
FIG. 4 illustrates an example of a new Huffman codebook according to some embodiments.

FIG. 4 illustrates an example of a new Huffman codebook 400 according to some embodiments. The Huffman codebook 300 of FIG. 3 is sorted in ascending order of the new binary codeword 302 (or the corresponding new integer codeword 304) to create the new Huffman codebook 400.

Figure 5:
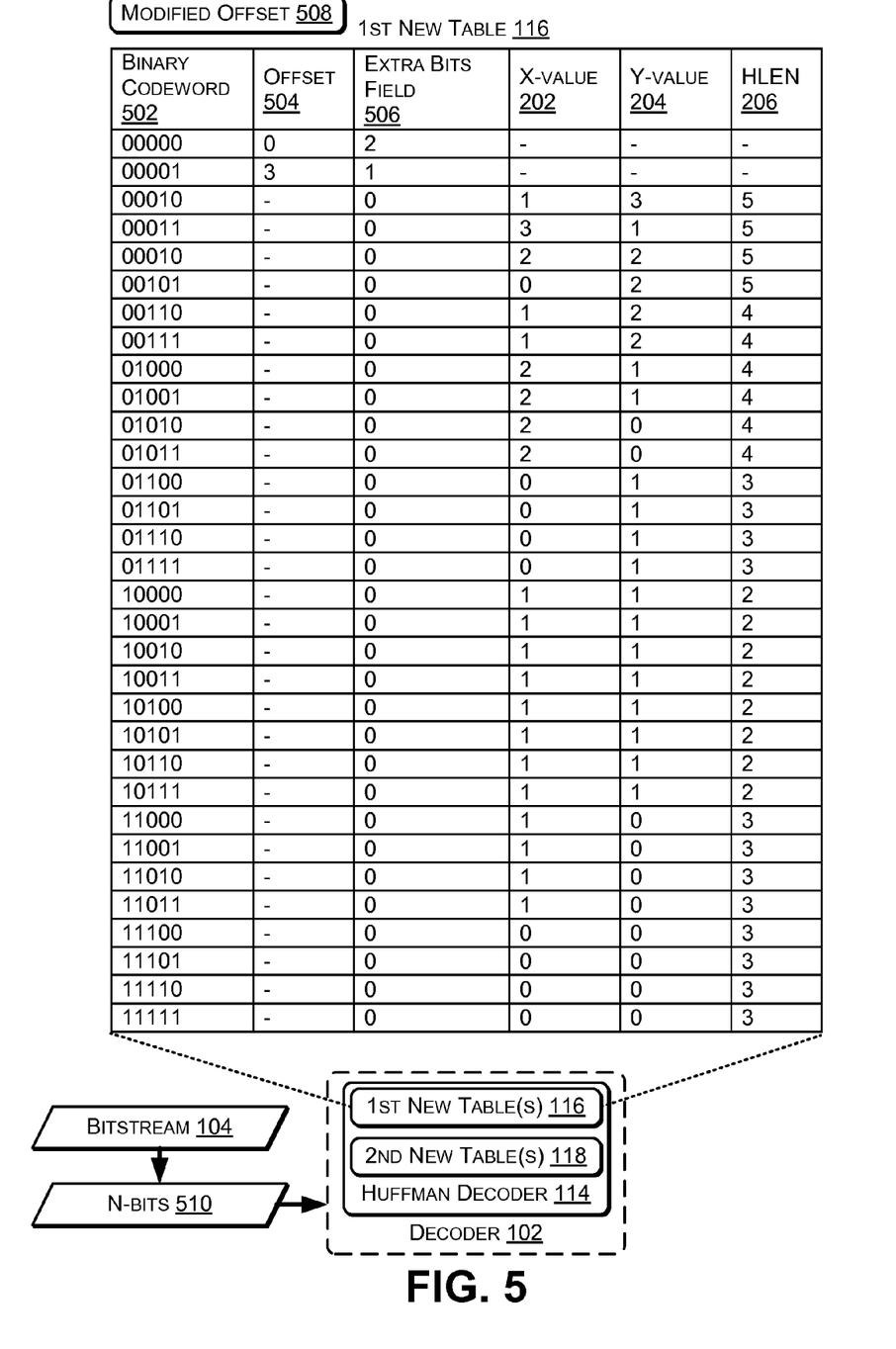
FIG. 5 illustrates an example of a first new table for Huffman decoding that is created based on the new Huffman codebook according to some embodiments.

FIG. 5 illustrates an example of the first new table 116 for Huffman decoding that is created based on the new Huffman codebook 400 of FIG. 4 according to some embodiments. When creating the first new table 116 and the second new table 118, a number N is chosen, where N<maxhlen, and the tables created such that codewords having an hlen less than or equal to N are looked up in the first table 116 and codewords having an hlen>N are looked up in the second table 118. For ease of discussion, hlen=seven and N=5 are selected to provide an example of how the first new table 116 and the second new table 118 are derived from the new Huffman codebook 400. However, it should be understood that, in some implementations, other values of N (e.g., N=2, N=3, N=4, N=6, etc.) may be used to create the first new table 116 and the second new table 118. The first new table may include multiple columns, such as an offset 504, an extra bits field 506, and the hlen (length of original codeword) 206. A modified offset 508 may be created by modifying the offset 504 based on a value of the extra bits field 506.

The first new table 116 may be indexed using a binary codeword 502 retrieved from the bitstream 104. The binary codeword 502 is illustrated as a column of the first new table 116 purely for ease of understanding, e.g., to illustrate how the binary codeword 502 is used to lookup X and Y (e.g., spectral) values in the first new table 116 and the second new table 118. In some implementations, the first new table 116 may be indexed using the binary codeword 502 without the binary codeword 502 being a column of the first new table 116. For example, in FIG. 5, N=5, so the first new table 116 has $2^N=32$ rows. Thus, the integer value i of the 5-bits that are retrieved from a bitstream may be used to directly access a corresponding row i of the first new table 116. For example, "00000" (integer value 0) is used to directly access row 0, "00001" (integer value 1) is used to directly access row 1, "00010" (integer value 2) is used to directly access row 2, etc.

When retrieving bits from the bitstream 104, N-bits 510 (in this example N=5) at a time are retrieved from the bitstream 104 and a lookup is performed in the first table 116 using the integer value of the N-bits 510. The extra bits field 506 indicates whether the codeword is to be looked up in the first table 116 or the second table 118. For example, when the extra bits field 506 is non-zero (e.g., one or two), then the second table 118 is used. When the extra bits field 506 is zero, then the first table 116 is used.

When the extra bits field 506 is non-zero, then the offset 504 of the corresponding row is retrieved from the first new table 116 (e.g., the X-value 202, the Y-value 204, and the hlen 206 may be ignored). The extra bits field 506 indicates how many additional bits to retrieve from the bitstream and append to the N-bits 510 for lookup in the second new table 118. The offset 504 is used to identify a portion of the second table 118 in which to perform the lookup.

When the extra bits field 506 is zero, then the X-value 202, the Y-value 204, and the hlen 206 of the corresponding row are directly retrieved from the first new table 116 based on the integer value of the bits (e.g., the offset 504 may be ignored). The hlen 206 indicates the length of the original (e.g., before being padded with zeros) codeword. The hlen 206 may be used to determine whether to discard any of the trailing zeros of the binary codeword 502. The X-value 202 and the Y-value 204 are used to reconstruct content encoded in the bitstream. For an MP3 bitstream, the X-value 202 and the Y-value 204 are the spectral (e.g. audio) data used to reconstruct the audio output.

In the following examples, the first row is considered row zero to enable the integer value of the 5-bits to directly access the corresponding row of the first new table 116. As a first example of using the first new table 116 when N=5, the Huffman decoder 114 may retrieve the 5-bit string "00011" (integer value 3) from the bitstream 104 and retrieve X=3 and Y=1 from row three. As another example, the Huffman decoder 114 may retrieve the 5-bit string "00111" (integer value seven) from the bitstream 104 and retrieve values X=2 and Y=1 from the seventh row.

In some implementations, the extra bits field 506 may be split into two separate columns, e.g., a one bit flag to indicate which table to access the values of X and Y (e.g., when flag=0 use the first new table 116 and when flag=1 use the second new table 118) and an extra bits column that specifies how many additional bits to retrieve when using the second new table 118.

Thus, decoding performance using the first new table 116 and the second new table 118 is much faster (e.g., compared to decoding using the conventional Huffman codebook 200) because (i) N-bits 510 at a time are retrieved from the bitstream and (ii) one table lookup, or at most two table lookups, are performed. In contrast, decoding using the conventional Huffman codebook 200 involves retrieving one bit at a time and performing a table search each time a bit is retrieved. Thus, when N=5, the Huffman decoder 114 of FIG. 1 may decode nearly 5-times faster (e.g., using the first new table 116 and the second new table 118) by retrieving 5-bits at a time and doing a table search for every 5-bits that are retrieved rather for every bit that is retrieved.

Because N-bits 510 are retrieved at a time, the first new table 116 includes $2^N$ rows. In FIG. 5, N=5, so the first new table 116 includes 32 rows. Thus, while decoding performance is faster, more memory may be used to store the first new table 116 as compared to the conventional Huffman codebook 200.

Figure 6:
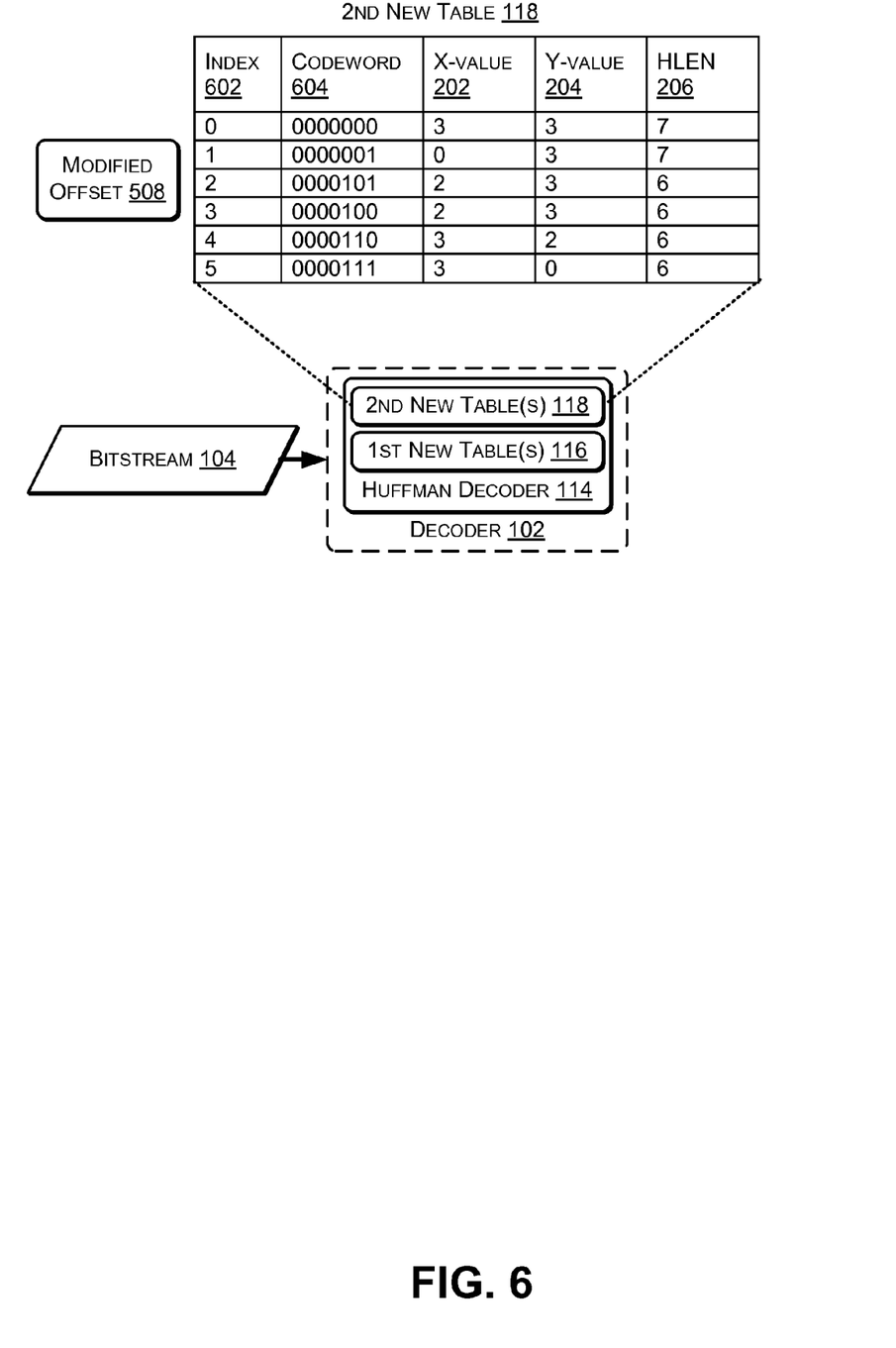
FIG. 6 illustrates an example of a second new table for Huffman decoding that is created based on the new Huffman codebook according to some embodiments.

FIG. 6 illustrates an example of the second new table 118 for Huffman decoding that is created based on the new Huffman codebook according to some embodiments. When the extra bits field 506 of FIG. 5 is non-zero (e.g., one or two), the offset 504 is used access a portion of the second new table 118 to perform the lookup.

When the bitstream 104 of FIG. 1 includes a 6-bit codeword, the Huffman decoder 114 of FIG. 1 may retrieve a 5-bit string "00001." The Huffman decoder 114 access row=1 of the first new table 116 of FIG. 5 and determines that one extra bit (e.g., extra bits field 506=one) is to be retrieved from the bitstream 104 and concatenated to the 5-bit string to create a 6-bit string. The offset 504 corresponding to the 5-bit string "00001" is three, indicating that the search of the second table 118 is to be performed starting with the row having an index=3. The new Huffman codebook 400 indicates that there are two codewords, e.g., "0000100" and "0000110," that start with "00001" and have hlen=6. Therefore, the extra bit will either be "0" or "1." If the extra bit is "0," then a lookup of "0000100" or "0000110" is performed. For "0000100," X=2 and Y=3 are retrieved from the second new table 118. For "0000110," X=3 and Y=2 are retrieved from the second new table 118. If the extra bit is "1," then the offset 504 is modified by adding the extra bit "1" to the offset "3" to create the value "4" of the modified offset 508. The modified offset 508 may then be used to perform the lookup in the second new table 118 starting at index=4. In this particular example, there are no codewords in the new Huffman codebook 400 with an hlen=6 and sixth bit of "1." However, this example is provided to understand how the modified offset may be created and used in larger tables with N>5.

When the bitstream 104 includes a 7-bit codeword, the Huffman decoder 114 may retrieve a 5-bit string "00000" from the bitstream 104. The Huffman decoder 114 may access row=0 of the first new table 116 and determine that two extra bits (e.g., extra bits 506=two) are to be retrieved from the bitstream 104 and concatenated to the 5-bit string to create a 7-bit string. The offset 504 corresponding to the 5-bit string "0000" is retrieved; in this example offset=0. The new Huffman codebook 400 indicates that there are two codewords with hlen=7, e.g., "0000000" and "0000001." Therefore, the two extra bits will either be "00" or "01." If the two extra bits are "00" then the modified offset 508 is the integer value of "0" (offset)+"00" (extra bits)=0 and a lookup is performed to retrieve X=3 and Y=3 from the second new table 118 using modified offset=0 (e.g., indexing row 0). If the two extra bits are "01" then the modified offset 508 is the integer value of "0" (offset)+"01" (extra bits)=1 and a lookup of "0000001" is performed to retrieve X=0 and Y=3 from the second new table 118 using modified offset=1 (e.g., indexing row 1).

Thus, of the sixteen codewords in the new Huffman codebook 400, twelve of the codewords (e.g., hlen less than of equal to five) are decoded using a single access of the first new table 116, e.g., teach row is directly access based on the integer value of the N bits retrieved from the bitstream without having to perform a search of a table. Four of the codewords (e.g., hlen greater than five) are decoded using one access of the first new table 116 and a search in a specified portion of the second new table 118 using the offset 504. The use of the offset 504 results in a faster lookup compared to searching all of the second new table 118 because they offset specifies where in the second new table 118 to begin the search. In this way, the Huffman decoder 114 may use the first new table 116 and the second new table 118 to retrieve the spectral values X and Y significantly faster (e.g., up to five times faster) compared to using the original Huffman codebook 200.

Figure 7:
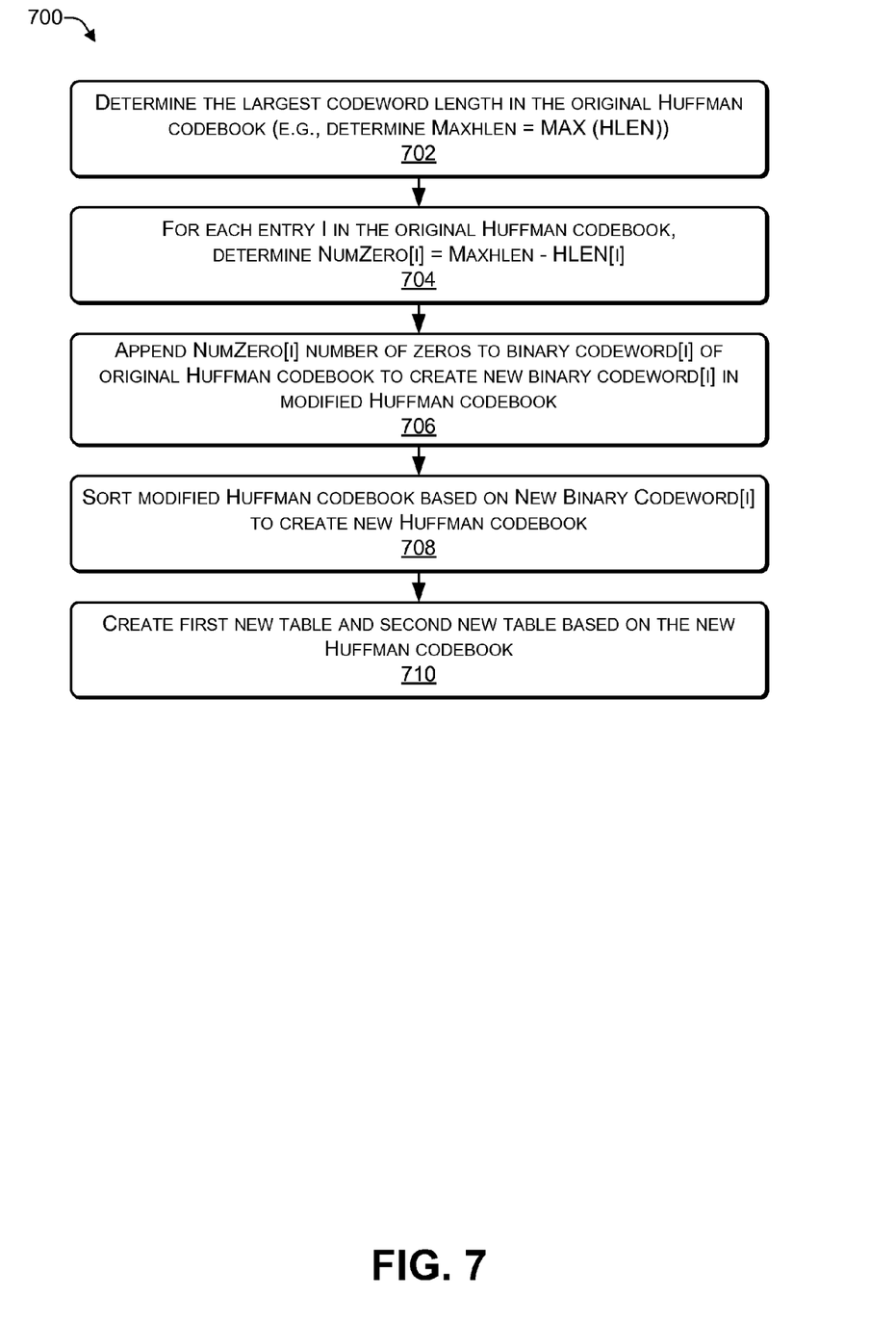
FIG. 7 is a flowchart of a process to create two new tables for Huffman decoding according to some embodiments.
Figure 8:
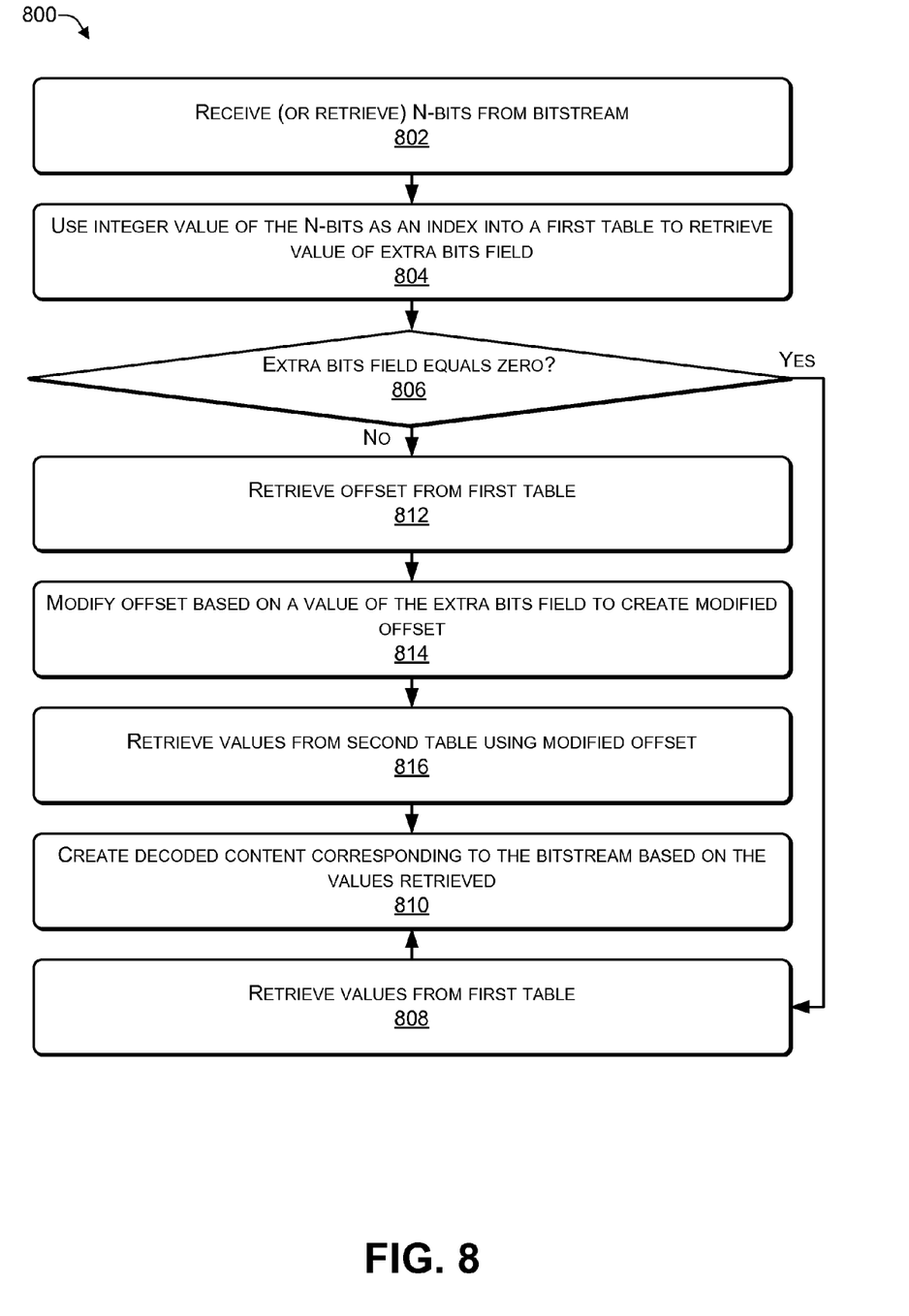
FIG. 8 is a flowchart of a process to decode a bitstream using two new tables according to some embodiments.

In the flow diagrams of FIGS. 7 and 8, each block represents one or more operations that can be implemented in hardware, software, or a combination thereof. In the context of software, the blocks represent computer-executable instructions that, when executed by one or more processors, cause the processors to perform the recited operations. Generally, computer-executable instructions include routines, programs, objects, modules, components, data structures, and the like that perform particular functions or implement particular abstract data types. The order in which the blocks are described is not intended to be construed as a limitation, and any number of the described operations can be combined in any order and/or in parallel to implement the processes. For discussion purposes, the processes 700 and 800 are described with reference to FIGS. 1-6, as described above, although other models, frameworks, systems and environments may implement these processes.

FIG. 7 is a flowchart of a process 700 to create two new tables for Huffman decoding according to some embodiments. The process 700 may be performed by a computing device, such as the computing device described in FIG. 9. In some implementations, the process 700 may be performed by the computing device to create the decoder 102, the Huffman decoder 114, or the new tables 116, 118. The computing device may send the decoder 102, the Huffman decoder 114, or the new tables 116, 118 to one or more additional computing devices to decode an encoded bitstream. For example, a computing device of a software provider (e.g., an operating system provider or application provider) may embed the decoder 102, the Huffman decoder 114, or the new tables 116, 118 in software using the computing device and provide the software for installation on additional computing devices.

At 702, the largest codeword length in the original Huffman codebook is determined. For example, in FIG. 2, the computing device may determine that the largest hlen 206 is seven in the original Huffman codebook 200. The largest codeword length is referred to as maxhlen.

At 704, for each entry (e.g., row) i in the original Huffman codebook, a number of zeros (NumZero[i]) is determined by subtracting the length of the codeword (hlen[i]) from the largest codeword length (maxhlen). At 706, for each entry (e.g., row) i in the original Huffman codebook, the number of zeros (NumZero[i]) that were previously determined are appended to a binary codeword (binary codeword[i]) to create a new binary codeword (new binary codeword[i]) to create a modified Huffman codebook. For example, in FIG. 3, the computing device may append four zeros (7−3=4) to binary codeword "111" to create new binary codeword "111000," append four zeros (7−3=4) to binary codeword "011" to create new binary codeword "011000," append two zeros (7−5=2) to binary codeword "10100" to create the new binary codeword "1010000," append no zeros (7−7=0) to binary codeword "1000000," and so on.

At 708, the modified Huffman codebook is sorted based on the new binary codeword to create the new Huffman codebook. For example, the computing device may sort the modified Huffman codebook 300 of FIG. 3 in ascending order of the new binary codeword to create the new Huffman codebook 400 of FIG. 4.

At 710, a first new table and a second new table are created based on the new Huffman codebook. For example, the computing device may use the new Huffman codebook 400 of FIG. 4 to create the first new table 116 and the second new table 118 based on the new Huffman codebook. For example, the computing device may select an integer N, where N<maxhlen, and the first new table 116 may be created with $2^N$ rows. The first new table 116 includes all codewords with hlen less than or equal to N. The second new table 118 includes all codewords with hlen greater than N.

FIG. 8 is a flowchart of a process 800 to decode a bitstream using two new tables according to some embodiments. The process 800 may be performed by the Huffman decoder 114 of FIG. 1 and FIG. 9. For example, the Huffman decoder 114 may be implemented using software instructions, firmware instructions, or both. The instructions of the Huffman decoder 114 may be executed by one or more processors to perform the process 800.

At 802, N-bits are retrieved from a bitstream. At 804, an integer value of the N-bits is used as an index into the first table to retrieve a value of an extra bits field. For example, in FIG. 1, the decoder 102 may retrieve N-bits 510 from the bitstream 104, and use the integer value i of the N-bits 510 to access row i of the first new table 116.

At 806, a determination is made as to whether the extra bits field equals zero. If the extra bits field is zero, at 806, then the process proceeds to 808, and values (e.g., X-value, Y-value, and hlen) are retrieved from the first table. At 810, the values that are retrieved are used to create decoded content (e.g., analog audio content) that corresponds to the data encoded in the bitstream. For example, in FIG. 5, the decoder 102 may access row i of the first new table 116 and determine whether the extra bits field 506 is zero. If the extra bits field 506 is zero, then the decoder 102 retrieves the X-value 202, the Y-value 204, and, in some cases, the hlen 206, from row i of the first new table 116. The X-value 202 and the Y-value 204 are used to create decoded media content that corresponds to the media content that is encoded in the bitstream.

If the extra bits field is non-zero, at 806, then the process proceeds to 812 and the offset is retrieved from the first table, at 808. At 814, the offset may be modified based on a value of the extra bits field to create a modified offset. At 816, the appropriate values are retrieved from the second table using the modified offset. At 810, the values that are retrieved are used to create decoded content (e.g., analog audio content) that corresponds to the data encoded in the bitstream. For example, in FIG. 5, if the extra bits field 506 is non-zero, the offset 504 is retrieved from the first new table 116 and modified to create the modified offset 508. To illustrate, the integer value of the extra bits field 506 may be added to the offset 504 to create the modified offset 508. In FIG. 6, the modified offset 508 is used to retrieve the X-value 202, the Y-value 204, and in some cases, the hlen 206 from the second new table 118. The X-value 202 and the Y-value 204 are used to create decoded media content that corresponds to the media content that is encoded in the bitstream.

Figure 9:
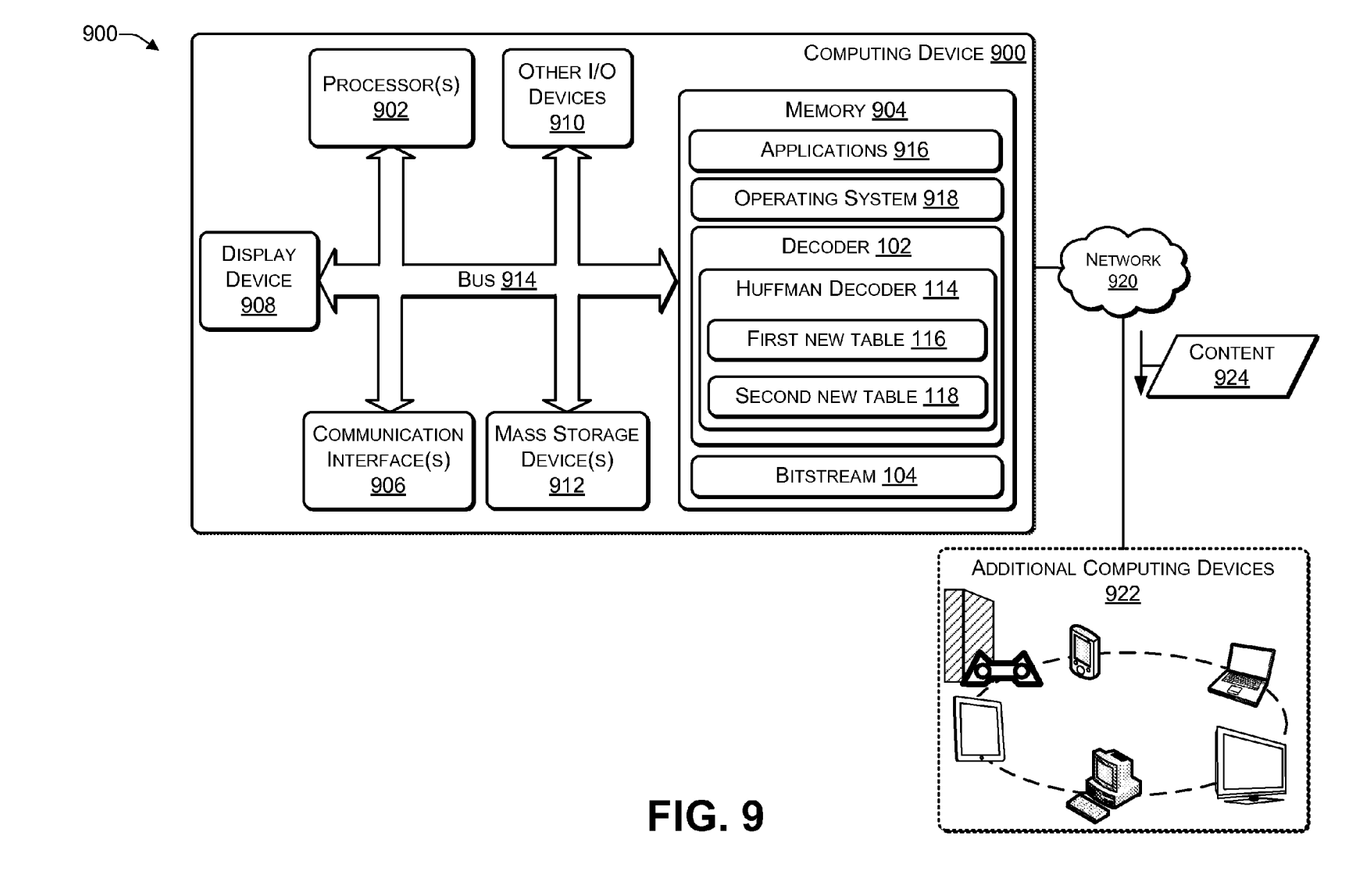
FIG. 9 illustrates an example configuration of a computing device that can be used to implement the systems and techniques described herein.

FIG. 9 illustrates an example configuration of a computing device 900 and environment that can be used to implement the modules and functions described herein. The computing device 900 may include at least one processor 902, a memory 904, communication interfaces 906, a display device 908, other input/output (I/O) devices 910, and one or more mass storage devices 912, configured to communicate with each other, such as via a system bus 914 or other suitable connection.

The processor 902 may be a single processing unit or a number of processing units, all of which may include single or multiple computing units or multiple cores. The processor 902 can be implemented as one or more microprocessors, microcomputers, microcontrollers, digital signal processors, central processing units, state machines, logic circuitries, and/or any devices that manipulate signals based on operational instructions. Among other capabilities, the processor 902 can be configured to fetch and execute computer-readable instructions stored in the memory 904, mass storage devices 912, or other computer-readable media.

Memory 904 and mass storage devices 912 are examples of computer storage media for storing instructions which are executed by the processor 902 to perform the various functions described above. For example, memory 904 may generally include both volatile memory and non-volatile memory (e.g., RAM, ROM, or the like). Further, mass storage devices 912 may generally include hard disk drives, solid-state drives, removable media, including external and removable drives, memory cards, flash memory, floppy disks, optical disks (e.g., CD, DVD), a storage array, a network attached storage, a storage area network, or the like. Both memory 904 and mass storage devices 912 may be collectively referred to as memory or computer storage media herein, and may be a non-transitory media capable of storing computer-readable, processor-executable program instructions as computer program code that can be executed by the processor 902 as a particular machine configured for carrying out the operations and functions described in the implementations herein.

The computer storage media, such as memory 904 and mass storage devices 912, may be used to store software and data. The software may include software applications 916, an operating system 918, and the decoder 102. The decoder 102 includes the Huffman decoder 114 that uses the first new table 116 and the second new table 118 to decode the bitstream 104.

The computing device 900 may be coupled to additional computing devices 922 via a network 920. The computing device 900 may provide content 924 to the additional computing devices 922. In some implementations, the content 924 may include audio content that the computing device 900 streams to the additional computing devices 922. In other implementations, the content 924 may include Huffman encoded content along with the new tables 116, 118, the Huffman decoder 114, or the decoder 102. In additional implementations, the content 924 may include the operating system 918, the applications 916, or both, in which case the operating system 918 or the applications 916 may include the new tables 116, 118, the Huffman decoder 114, or the decoder 102.

The computing device 900 may also include one or more communication interfaces 906 for exchanging data with the additional computing devices 922, such as via the network 920, direct connection, or the like, as discussed above. The communication interfaces 906 can facilitate communications within a wide variety of networks and protocol types, including wired networks (e.g., Ethernet, DOCSIS, DSL, Fiber, USB etc.) and wireless networks (e.g., WLAN, GSM, CDMA, 802.11, bluetooth, Wireless USB, cellular, satellite, etc.), the Internet and the like. Communication interfaces 906 can also provide communication with external storage (not shown), such as in a storage array, network attached storage, storage area network, or the like.

A display device 908, such as a monitor may be included in some implementations for displaying information and images to users. Other I/O devices 910 may be devices that receive various inputs from a user and provide various outputs to the user, and may include a keyboard, a remote controller, a mouse, a printer, audio input/output devices, and so forth.

Memory 904 may include modules and components for improved Huffman decoding according to the implementations herein. Memory 904 may also include other data and data structures described herein, such as the bitstream 104 and the new tables 116, 118. Memory 904 may further include one or more other modules 916, such as the operating system 918, drivers, communication software, or the like. Memory 904 may also include other data, such as data stored while performing the functions described above and data used by the other modules.

The example systems and computing devices described herein are merely examples suitable for some implementations and are not intended to suggest any limitation as to the scope of use or functionality of the environments, architectures and frameworks that can implement the processes, components and features described herein. Thus, implementations herein are operational with numerous environments or architectures, and may be implemented in general purpose and special-purpose computing systems, or other devices having processing capability. Generally, any of the functions described with reference to the figures can be implemented using software, hardware (e.g., fixed logic circuitry) or a combination of these implementations. The term "module," "mechanism" or "component" as used herein generally represents software, hardware, or a combination of software and hardware that can be configured to implement prescribed functions. For instance, in the case of a software implementation, the term "module," "mechanism" or "component" can represent program code (and/or declarative-type instructions) that performs specified tasks or operations when executed on a processing device or devices (e.g., CPUs or processors). The program code can be stored in one or more computer-readable memory devices or other computer storage devices. Thus, the processes, components and modules described herein may be implemented by a computer program product.

Furthermore, this disclosure provides various example implementations, as described and as illustrated in the drawings. However, this disclosure is not limited to the implementations described and illustrated herein, but can extend to other implementations, as would be known or as would become known to those skilled in the art. Reference in the specification to "one implementation," "this implementation," "these implementations" or "some implementations" means that a particular feature, structure, or characteristic described is included in at least one implementation, and the appearances of these phrases in various places in the specification are not necessarily all referring to the same implementation.

Software modules include one or more of applications, bytecode, computer programs, executable files, computer-executable instructions, program modules, code expressed as source code in a high-level programming language such as C, C++, Perl, or other, a low-level programming code such as machine code, etc. An example software module is a basic input/output system (BIOS) file. A software module may include an application programming interface (API), a dynamic-link library (DLL) file, an executable (e.g., .exe) file, firmware, and so forth.

Processes described herein may be illustrated as a collection of blocks in a logical flow graph, which represent a sequence of operations that can be implemented in hardware, software, or a combination thereof. In the context of software, the blocks represent computer-executable instructions that are executable by one or more processors to perform the recited operations. The order in which the operations are described or depicted in the flow graph is not intended to be construed as a limitation. Also, one or more of the described blocks may be omitted without departing from the scope of the present disclosure.

Although various embodiments of the method and apparatus of the present invention have been illustrated herein in the Drawings and described in the Detailed Description, it will be understood that the invention is not limited to the embodiments disclosed, but is capable of numerous rearrangements, modifications and substitutions without departing from the scope of the present disclosure.

What is claimed is:

1. A computer-implemented method, comprising:
    determining a largest codeword length in a Huffman codebook comprising a plurality of codewords;
    for each codeword of the plurality of codewords, determining a number of zeros to append to each codeword such that a length of the codeword with appended zeros equals the largest codeword length;
    for each codeword of the plurality of codewords, appending the number of zeros to each codeword to create new codewords in a modified Huffman codebook;
    sorting the modified Huffman codebook based on the new codewords to create a new Huffman codebook;
    retrieving a plurality of bits of a bitstream that comprises encoded media content;
    determining an index into a first table of the new Huffman codebook based on an integer value of the plurality of bits;
    retrieving, based on the index, an extra bits field from the first table;
    retrieving a first plurality of values from the first table in response to determining that the extra bits field includes a predetermined value; and
    creating first decoded media content corresponding to the encoded media content based at least partly on the first plurality of values.

2. The computer-implemented method of claim 1, further comprising:
    outputting at least two channels of analog audio output based on the first decoded media content.

3. The computer-implemented method of claim 1, further comprising:
- in response to determining that the extra bits field excludes the predetermined value, retrieving, based on the index, an offset from the first table; and
- modifying the offset based on the extra bits fields to create a modified offset.

4. The computer-implemented method of claim 3, further comprising:
- retrieving, based on the modified offset, a second plurality of values from a second table; and
- creating second decoded media content corresponding to the encoded media content based at least partly on the second plurality of values.

5. The computer-implemented method of claim 4, further comprising:
- retrieving, based on the extra bits field, additional bits from the bitstream; and
- appending the additional bits to the plurality of bits to create a codeword that is associated with the second plurality of values.

6. The computer-implemented method of claim 1, wherein the encoded media content is encoded using Motion Pictures Experts Group (MPEG)-2 audio level III compression.

7. The computer-implemented method of claim 1, wherein the plurality of bits comprise at least a portion of a codeword.

8. The computer-implemented method of claim 1, wherein the first plurality of values comprises spectral values.

9. One or more non-transitory computer-readable media, comprising instructions that are executable by one or more processors to perform acts comprising:
- determining a largest codeword length in a Huffman codebook comprising a plurality of codewords;
- for each codeword of the plurality of codewords, determining a number of zeros to append to each codeword such that a length of the codeword with appended zeros equals the largest codeword length;
- for each codeword of the plurality of codewords, appending the number of zeros to each codeword to create new codewords in a modified Huffman codebook;
- sorting the modified Huffman codebook based on the new codewords to create a new Huffman codebook;
- retrieving a plurality of bits from a bitstream that comprises encoded audio content;
- determining an index into a first table of the new Huffman codebook based on an integer value of the plurality of bits;
- retrieving, based on the index, an extra bits field from the first table;
- in response to determining that the extra bits field excludes a predetermined value, retrieving an offset from the first table;
- modifying the offset based on the extra bits fields to create a modified offset;
- retrieving, based on the modified offset, a second plurality of values from a second table of the new Huffman codebook; and
- creating second decoded media content corresponding to the encoded audio content based at least partly on the second plurality of values.

10. The one or more non-transitory computer-readable media of claim 9, further comprising:
- in response to determining that the extra bits field includes a predetermined value, retrieving a first plurality of values from the first table; and
- creating first decoded media content corresponding to the encoded audio content based at least partly on the first plurality of values.

11. The one or more non-transitory computer-readable media of claim 9, further comprising:
- retrieving, based on the extra bits field, additional bits from the bitstream; and
- appending the additional bits to the plurality of bits to create a codeword that is associated with the second plurality of values.

12. A computing device, comprising:
- one or more processors; and
- one or more computer-readable media storing instructions that are executable by the one or more processors to perform acts comprising:
  - determining a largest codeword length in a Huffman codebook comprising a plurality of codewords;
  - for each codeword of the plurality of codewords, determining a number of zeros to append to each codeword such that a length of the codeword with appended zeros equals the largest codeword length;
  - for each codeword of the plurality of codewords, appending the number of zeros to each codeword to create new codewords in a modified Huffman codebook;
  - sorting the modified Huffman codebook based on the new codewords to create a new Huffman codebook;
  - retrieving a plurality of bits of a bitstream that comprises encoded media content;
  - creating, based on the new Huffman codebook, a first table that is indexed based on an integer value of the plurality of bits; and
  - creating, based on the new Huffman codebook, decoded media content corresponding to the encoded media content.

13. The computing device of claim 12, further comprising:
- creating, based on the new Huffman codebook, a second table; and
- sending the first table and the second table to at least one additional computing device.

14. The computing device of claim 12, wherein:
- the plurality of bits comprise at least a portion of a particular codeword of the new Huffman codebook.

15. The computing device of claim 12, wherein:
- an extra bits field in the first table indicates whether to retrieve a plurality of values from the first table or a second table.

16. The computing device of claim 15, wherein:
- when the extra bits field in the first table indicates to retrieve the plurality of values from the second table, an offset is retrieved from the first table and used to retrieve the plurality of values from the second table.

17. The computing device of claim 15, wherein the plurality of values comprise spectral values that are associated with each of the new codewords.

18. The computing device of claim 12, wherein:
- an extra bits field in the first table indicates whether to retrieve a number of additional bits from the bitstream.

19. The computing device of claim 18, wherein:
- when the extra bits field in the first table indicates to retrieve the number of additional bits from the bitstream:
  - the number of additional bits are retrieved from the bitstream; and
  - the number of additional bits are appended to the plurality of bits to create a codeword.

20. The computing device of claim 12, wherein:
the encoded media content is encoded using Motion Pictures Experts Group (MPEG)-2 audio level III compression; and
the decoded media content comprises at least two channels of analog audio.

* * * * *